United States Patent
Schmidt

(10) Patent No.: US 10,005,696 B2
(45) Date of Patent: Jun. 26, 2018

(54) ARTICLE HAVING COATING INCLUDING COMPOUND OF ALUMINUM, BORON AND NITROGEN

(71) Applicant: United Technologies Corporation, Hartford, CT (US)

(72) Inventor: Wayde R. Schmidt, Pomfret Center, CT (US)

(73) Assignee: United Technologies Corporation, Farmington, CT (US)

(*) Notice: Subject to any disclaimer, the term of this patent is extended or adjusted under 35 U.S.C. 154(b) by 98 days.

(21) Appl. No.: 15/022,572

(22) PCT Filed: Aug. 25, 2014

(86) PCT No.: PCT/US2014/052450
§ 371 (c)(1),
(2) Date: Mar. 17, 2016

(87) PCT Pub. No.: WO2015/041802
PCT Pub. Date: Mar. 26, 2015

(65) Prior Publication Data
US 2016/0207838 A1 Jul. 21, 2016

Related U.S. Application Data

(60) Provisional application No. 61/879,373, filed on Sep. 18, 2013.

(51) Int. Cl.
*C04B 35/80* (2006.01)
*C04B 35/628* (2006.01)
(Continued)

(52) U.S. Cl.
CPC ...... *C04B 35/62868* (2013.01); *C04B 35/565* (2013.01); *C04B 35/584* (2013.01);
(Continued)

(58) Field of Classification Search
USPC ........ 428/446, 698, 704, 375, 378, 379, 389
See application file for complete search history.

(56) References Cited

U.S. PATENT DOCUMENTS

| | | | |
|---|---|---|---|
| 4,946,809 A | 8/1990 | Paciorek et al. | |
| 5,194,338 A | 3/1993 | Niebylski | |

(Continued)

FOREIGN PATENT DOCUMENTS

| | | |
|---|---|---|
| EP | 0310043 | 4/1989 |
| JP | 2005223126 | 8/2005 |
| JP | 2008098512 | 4/2008 |

OTHER PUBLICATIONS

Liljeholm et al "Synthesis and characterization of (0001)-textured wurtzite Al(1-x)B(x)N thin films" Surf. & Techn. 206 (2011) p. 1033-1036.*

(Continued)

*Primary Examiner* — Archene Turner
(74) *Attorney, Agent, or Firm* — Carlson, Gaskey & Olds, P.C.

(57) ABSTRACT

An article includes a substrate and a coating on the substrate. The coating includes a compound of aluminum, boron and nitrogen in a continuous chemically bonded network having Al—N bonds and B—N bonds. Also disclosed is an article wherein the substrate is a plurality of fibers and the coating is a conformed coating of a compound of aluminum, boron and nitrogen having Al—N bonds and B—N bonds. The fibers are disposed in a matrix. Also disclosed is a method of protecting an article from environmental conditions. The method includes protecting a substrate that is susceptible to environmental chemical degradation using a coating that includes a compound of aluminum, boron and nitrogen having Al—N bonds and B—N bonds.

18 Claims, 2 Drawing Sheets

(51) Int. Cl.

| | |
|---|---|
| *C23C 16/34* | (2006.01) |
| *D06M 11/58* | (2006.01) |
| *D06M 11/80* | (2006.01) |
| *C04B 41/87* | (2006.01) |
| *C04B 41/00* | (2006.01) |
| *C04B 41/50* | (2006.01) |
| *F01D 5/28* | (2006.01) |
| *C04B 35/565* | (2006.01) |
| *C04B 35/584* | (2006.01) |
| *D06M 101/40* | (2006.01) |

(52) U.S. Cl.
CPC .. *C04B 35/62865* (2013.01); *C04B 35/62884* (2013.01); *C04B 35/80* (2013.01); *C04B 35/806* (2013.01); *C04B 41/009* (2013.01); *C04B 41/5063* (2013.01); *C04B 41/87* (2013.01); *C23C 16/34* (2013.01); *D06M 11/58* (2013.01); *D06M 11/80* (2013.01); *F01D 5/288* (2013.01); *C04B 2235/524* (2013.01); *C04B 2235/5244* (2013.01); *C04B 2235/5248* (2013.01); *D06M 2101/40* (2013.01); *F05D 2300/222* (2013.01); *F05D 2300/2281* (2013.01); *F05D 2300/2282* (2013.01)

(56) References Cited

U.S. PATENT DOCUMENTS

| | | | |
|---|---|---|---|
| 5,558,908 A | 9/1996 | Lukacs, III et al. | |
| 5,766,783 A * | 6/1998 | Utsumi | C23C 14/0641 428/698 |
| 5,882,778 A * | 3/1999 | Sugizaki | C23C 14/06 428/704 |
| 5,985,430 A | 11/1999 | Baldus et al. | |
| 6,228,453 B1 | 5/2001 | Fareed et al. | |
| 8,323,796 B2 | 12/2012 | Schmidt et al. | |
| RE44,414 E | 8/2013 | Yamamoto et al. | |
| 2006/0134415 A1 | 6/2006 | Gogotsi et al. | |
| 2008/0064585 A1 | 3/2008 | Wan et al. | |
| 2010/0255289 A1 | 10/2010 | Lewinsohn et al. | |
| 2013/0026482 A1 | 1/2013 | Fenwick | |
| 2013/0052477 A1 | 2/2013 | Lechthaler et al. | |

OTHER PUBLICATIONS

Witthaut et al "Electron spectroscopy of single-phase (Al,B)N films" Surf & Inter Analy 30 (2000) p. 580-584.*

Edgar et al "C—Boron—aluminum nitride alloys prepared by ion-beam assisted deposition" Thin Solid Films 298 (1997) p. 33-38.*

Schmidt, W.R, et al. (1999). Poly(borosilazane) Precursors to ceramic nanocomposites. Chem. Mater. 1999, American Chemical Society, 1455-1464.

Kwon, D., Schmidt, W.R., Interrante, L.V., Marchetti, P., and Maciel, G. (1991). Preparation and microstructure of organometallic polymer derived AlN—BN composites. Inorganic and Organometallic Oligomers and Polymers. p. 191-197.

Watanabe, S. et al. Refractive indices $B_xAl_{1-x}N$ ( x=0-0.012) and $B_yGa_{1-y}N$ (y=0-0.023) epitaxial layers in ultraviolet region. Dec. 2013.

Nakajima, A. et al. Growth of $B_xAl_{1-x}N$ layers using decaborane on SiC substrates. Journal of Crystal Growth. May 2005. vol. 278, No. 1-4, pp. 437-442.

Delcamp, A. et al. Al—O—N and Al—O—B—N thin films applied on Si—O—C fibers. Composites Science and Tecnology, Elsevier, Amsterdam, NL, vol. 70, No. 4, Apr. 1, 2010, pp. 622-626.

Supplementary European Search Report for European Patent Application No. 14845964.7 completed Apr. 12, 2017.

International Preliminary Report on Patentability for PCT Application No. PCT/US2014/052450 completed Mar. 22, 2016.

* cited by examiner

ARTICLE HAVING COATING INCLUDING COMPOUND OF ALUMINUM, BORON AND NITROGEN

CROSS-REFERENCE TO RELATED APPLICATION

This application claims priority to U.S. Provisional Application No. 61/879,373, filed Sep. 18, 2013.

BACKGROUND

Gas turbine engine components and other types of structures can be fabricated from ceramic matrix composites. One type of ceramic matrix composite includes ceramic or carbon fibers distributed in a ceramic matrix. The fibers can be coated with a relatively thin layer of boron nitride to protect the underlying fibers from environmental conditions that can cause chemical degradation.

SUMMARY

An article according to an example of the present disclosure includes a substrate and a coating on the substrate. The coating includes a compound of aluminum (Al), boron (B) and nitrogen (N) in a continuous chemically bonded network having Al—N bonds and B—N bonds.

In a further embodiment of any of the foregoing embodiments, the compound has a composition $B_xAl_{(1-x)}N$, where x is 0.001 to 0.999.

In a further embodiment of any of the foregoing embodiments, the coating includes an amount of B—N, by weight, of no greater than 50%.

In a further embodiment of any of the foregoing embodiments, the continuous chemically bonded network has a homogenous distribution of the Al—N bonds and the B—N bonds.

In a further embodiment of any of the foregoing embodiments, the Al—N bonds and the B—N bonds are molecularly distributed such that the continuous chemically bonded network has a nanodispersion of domains of the Al—N bonds and the B—N bonds.

In a further embodiment of any of the foregoing embodiments, the substrate is a plurality of fibers.

In a further embodiment of any of the foregoing embodiments, the coating has a uniform thickness and consists of the compound of aluminum (Al), boron (B) and nitrogen (N).

In a further embodiment of any of the foregoing embodiments, the coating includes, by weight percent, a greater amount of aluminum (Al) than boron (B).

In a further embodiment of any of the foregoing embodiments, the compound includes an atom of nitrogen covalently bonded to atoms of boron and aluminum.

An article according to an example of the present disclosure includes a plurality of fibers having a conformed coating thereon. The conformed coating includes a compound of aluminum (Al), boron (B) and nitrogen (N) including Al—N bonds and B—N bonds, and a matrix in which the plurality of fibers is disposed.

In a further embodiment of any of the foregoing embodiments, the compound has a composition $B_xAl_{(1-x)}N$, where x is 0.001 to 0.999.

In a further embodiment of any of the foregoing embodiments, the confirmed coating includes an amount of B—N, by weight, of no greater than 50%.

In a further embodiment of any of the foregoing embodiments, the compound is a continuous chemically bonded network including the Al—N bonds and the B—N bonds.

In a further embodiment of any of the foregoing embodiments, the plurality of fibers is selected from the group consisting of silicon-containing fibers, carbon fibers and combinations thereof.

In a further embodiment of any of the foregoing embodiments, the plurality of fibers is silicon carbide fibers.

In a further embodiment of any of the foregoing embodiments, the conformed coating contacts peripheral surfaces of central cores of the fibers.

In a further embodiment of any of the foregoing embodiments, the matrix is a silicon-containing material.

A method of protecting an article from environmental conditions according to an example of the present disclosure includes protecting a substrate that is susceptible to environmental chemical degradation using a coating on the substrate. The coating includes a compound of aluminum (Al), boron (B) and nitrogen (N) having Al—N bonds and B—N bonds.

In a further embodiment of any of the foregoing embodiments, the compound has a composition $B_xAl_{(1-x)}N$, where x is 0.001 to 0.999.

In a further embodiment of any of the foregoing embodiments, the coating includes an amount of B—N, by weight, of no greater than 50%.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
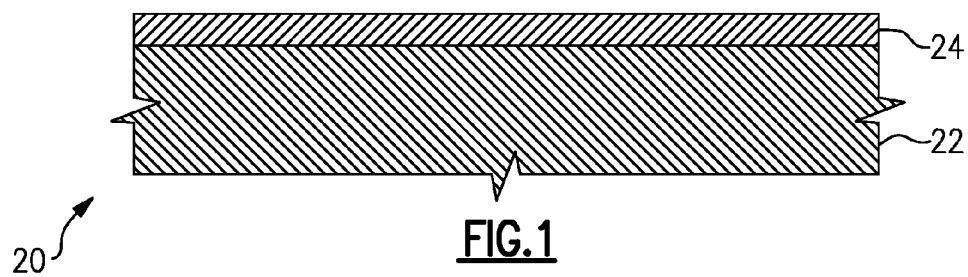
FIG. 1 illustrates an example article that includes a coating having a compound of aluminum, boron and nitrogen in a continuous chemically bonded network having Al—N bonds and B—N bonds.

FIG. 1 schematically illustrates a representative portion of an article 20. It is to be understood that the article 20 is shown with a generic shape. However, the article 20 can be formed with a shape that is desirable for the end-use application. For example, the article 20 can be a gas turbine engine component, or portion thereof. Other types of structures that are exposed to relatively severe environmental conditions can also benefit from this disclosure. As will be described in more detail, the article 20 includes a specialized coating for protecting an underlying substrate from environmental conditions that can otherwise cause accelerated chemical degradation.

Figure 2:
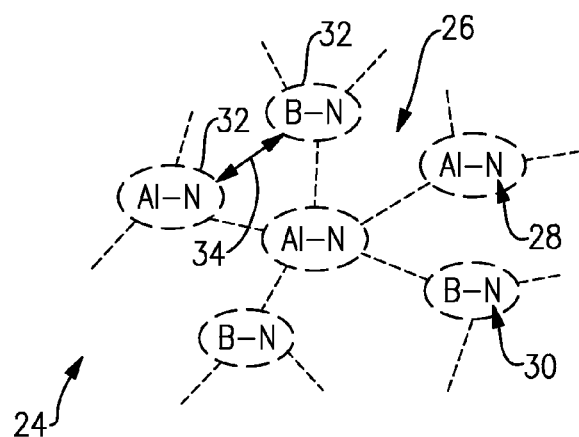
FIG. 2 schematically illustrates an example continuous chemically bonded network.

In the illustrated example, the article 20 includes a substrate 22 and a coating 24 on the substrate 22. The coating 24 in this example is continuous, conforms to the shape of the substrate 22 and is of uniform thickness. The coating 24, also shown in schematic microscopic view in FIG. 2, includes a compound of aluminum, boron and nitrogen in a continuous chemically bonded network 26 that has Al—N bonds 28 and B—N bonds 30. As can be appreciated, the view shown in FIG. 2 is a highly schematic representation of the chemical structure. The coating 24 can be formed essentially of the compound of aluminum, boron and nitrogen, although in some examples, the coating 24 could include additional phases or the coating 24 could include the compound of aluminum, boron and nitrogen in distinct, discrete regions that are dispersed though a continuous phase of another material. However, it is expected that the coating 24 formed only of, essentially of, or at least primarily of, the compound of aluminum, boron and nitrogen will provide the most enhanced environmental protection to the substrate 22.

The composition of the compound of aluminum, boron and nitrogen can be varied to alter thermal conductivity, oxidation resistance and possibly other properties of the coating 24. In one example, the compound of aluminum, boron and nitrogen has a composition $B_xAl_{(1-x)}N$, where x is 0.001 to 0.999. The prescribed composition yields, at least initially upon deposition, a single phase. The single phase is, however, inherently metastable and can phase separate under prolonged use of the article 20 at elevated temperatures into aluminum nitride and boron nitride phases. The composition $B_xAl_{(1-x)}N$ and an amount of B—N, by weight, of no greater than 10% contribute to the thermal stability of the compound and ensures that, at least initially upon deposition, the compound is a single phase. In this regard, the network 26, and thus the coating 24, has a homogenous distribution of the Al—N bonds and the B—N bonds. In other words, the Al—N and B—N are molecularly distributed such that the network 26 has a nanodispersion of domains of Al—N and B—N. The composition $B_xAl_{(1-x)}N$ and an amount of B—N, by weight, of no greater than 50% are also preferred compositions for certain desirable properties. In FIG. 2, these domains are represented at 32, and the nanodispersion of the domains 32 is represented by an average domain spacing 34 of one-hundred nanometers or less. Alternatively, the nanodispersion can be represented by an average maximum domain size of one-hundred nanometers or less. The nanodispersion provides enhanced thermal conductivity and oxidation resistance, among other possible benefits.

In further examples of the composition $B_xAl_{(1-x)}N$, the Al—N and B—N are provided in a ratio, by weight. In some examples, the ratio can be between 90:10 and 50:50, such as 75:25 or 50:50. Within the given ratio range, boron is always the least abundant. Aluminum is most abundant at ratios of 90:10 and 75:25, and nitrogen is more abundant than aluminum at the 50:50 ratio (43% N, 40% Al).

The enhanced thermal conductivity and oxidation resistance contribute to protecting the underlying substrate 22 from environmental conditions that can otherwise cause chemical degradation of the material of the substrate 22, such as but not limited to oxidation. In some examples, the coating 24 is thus particularly useful for protecting substrates that include materials that are susceptible to chemical degradation under the expected environmental conditions in which the article 20 will be used. For example, gas turbine engine components can be subjected to extreme elevated temperatures (e.g., above 750° C.) in the presence of moisture. In such conditions, the coating 24 protects the underlying substrate 22 from chemical degradation. In one example, the substrate 22 is a silicon-containing material or a carbon (e.g., graphite) material. In further examples, the substrate 22 is or includes silicon carbide. In further examples, the substrate 22 is or includes silicon carbide nitride, silicon nitride carbide or silicon nitride. The substrate 22 can be a monolithic structure of these phases or a composite structure containing these phases.

Figure 3:
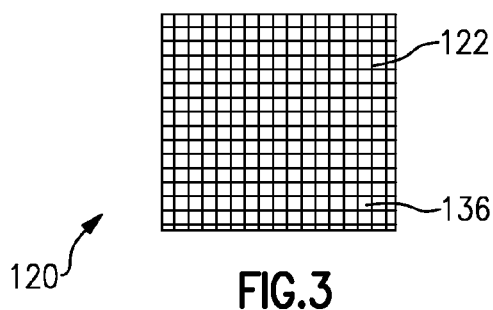
FIG. 3 illustrates another example article that includes fibers having a conformed coating thereon that has a compound of aluminum, boron and nitrogen with Al—N bonds and B—N bonds in a matrix.
Figure 4:
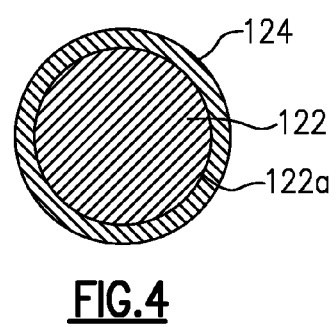
FIG. 4 illustrates a representative one of the fibers of the article of FIG. 3.

FIG. 3 illustrates another example article 120. In this disclosure, like reference numerals designate like elements where appropriate and reference numerals with the addition of one-hundred designate modified elements that incorporate the same features and benefits of the corresponding elements. In this example, the article 120 includes a plurality of fibers 122, a representative one of which is shown in FIG. 4, and a matrix 136 in which the plurality of fibers 122 are disposed. As can be appreciated, the fibers 122 can be provided in any desirable fiber structure within the article 120, such as, but not limited to unidirectional arrangements, woven arrangements or other arrangements.

As shown in FIG. 4, the fibers 122 serve as the substrate and have a conformed coating 124 thereon. The conformed coating 124 continuously surrounds the fiber 122, conforms to the shape of the fiber 122 and is of uniform thickness. In this example, the coating 124 contacts peripheral surfaces 122a of central cores of the fibers 122. That is, there are no intervening coatings between the fibers 122 and the coating 124, although an intervening layer(s) is not precluded. Similar to the coating 124 of FIG. 1, the conformed coating 124 includes a compound of aluminum, boron and nitrogen that has Al—N bonds and B—N bonds. In one further example, the compound of the aluminum, boron and nitrogen is a continuous chemically bonded network having the Al—N bonds and the B—N bonds, as described above and shown in FIG. 2.

In a further example, the fibers 122 are selected from silicon-containing fibers, carbon fibers or combinations thereof. In particular, silicon-containing fibers, such as silicon carbide fibers, silicon nitride carbide fibers, silicon carbide nitride fibers and silicon nitride fibers, and carbon (e.g., graphite) fibers can be susceptible to environmental conditions that chemically degrade the silicon-containing material or carbon. In this regard, the conformed coating 124 protects the underlying fiber 122 from chemical degradation.

The matrix 136 of the article 120 can also include the same or different silicon-containing material. For example, the silicon-containing material of the matrix 136 is a continuous or discontinuous phase of silicon carbide, silicon carbide nitride, silicon nitride carbide or silicon nitride. Alternatively, the matrix 136 is or includes other continuous or discontinuous phases, such as but not limited to carbides, nitrides, oxides, oxycarbides, oxynitrides, phosphides, sulfides or combinations thereof. Additionally, the matrix 136 can be monolithic or can be a composite of several phases of different compositions.

The coating 24/124 can be deposited onto the substrate 22/122 using any or all of a variety of different deposition techniques. In one example, the coating 24/124 is deposited using a vapor deposition technique involving organometallic and metal organic precursors. For instance, the precursors are $Me_3NAlH_3$ and $NH_3BH_3$. In another example, the coating 24/124 can be deposited using a polymer deposition technique. For instance, the polymer deposition technique involves the deposition of a polymer from a reaction of tris-ethylaminoborane with diethyl aluminum amide, followed by pyrolysis or co-deposition in ammonia. Other deposition methods such as those based on deposition followed by reaction are also contemplated (e.g. deposition from an aluminum-containing salt solution followed by nitridation with ammonia).

The above techniques can be used to deposit the compositions as disclosed above, including the composition $B_xAl_{(1-x)}N$, where x is 0.001 to 0.999. The deposition parameters can be controlled to control the value of x in the given composition. Depending upon the value of x, a single phase of the compound of aluminum, boron and nitride can be deposited. Thus, by controlling the deposition parameters and value of x in the composition, a single phase of the coating 24/124 can be deposited, as well as compounds of aluminum, boron and nitrogen that are dual phase of boron nitride and aluminum nitride. The deposition parameters and value of x can also be controlled to modify the extent and type of crystallinity of the compound in the coating 24/124. In addition to the deposition process and materials used, parameters such as deposition time, temperature and atmosphere are the primary parameters of control and, given this disclosure, the skilled artisan will be able to determine suitable parameters to achieve desired values of x in the composition and desired phase or phases with desired degrees of crystallinity.

Figure 5A:
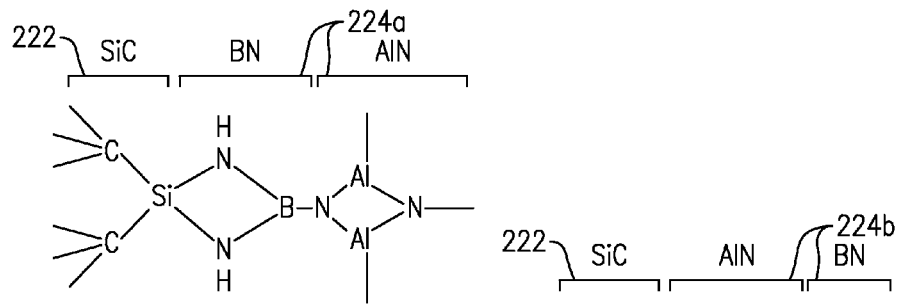
FIGS. 5A, 5B and 5C illustrate molecular level views of additional example compounds of aluminum, boron and nitrogen in a continuous chemically bonded network having Al—N bonds and B—N bonds.
Figure 5B:
Figure 5B:
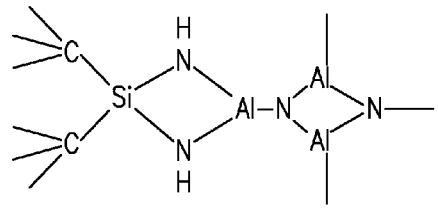
Figure 5C:
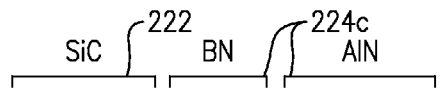
Figure 5C:
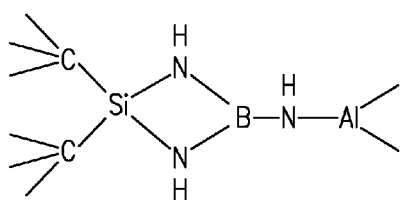

FIGS. 5A, 5B and 5C show additional molecular level views of compounds of aluminum, boron and nitrogen in a continuous chemically bonded network having Al—N bonds and B—N bonds. In these examples, a substrate 222 is silicon carbide that is covalently bonded to coating 224a, 224b or 224c, respectively. In coating 224a, the silicon atom of the substrate 222 is covalently bonded to two nitrogen atoms, which in turn are covalently bonded to a single boron atom. The boron atom is also covalently bonded to another nitrogen atom, which is also covalently bonded to two aluminum atoms. Coating 224b is similar, but the boron and aluminum atoms are transposed. In coating 224c, the silicon atom of the substrate 222 is covalently bonded to two nitrogen atoms, which in turn are covalently bonded to a single boron atom. The boron atom is also covalently bonded to another nitrogen atom, which is also covalently bonded to a single aluminum atom rather than two nitrogen atoms as in coating 224a.

Figure 6A:
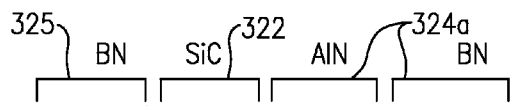
FIGS. 6A and 6B illustrate molecular level views of additional example compounds of aluminum, boron and nitrogen in a continuous chemically bonded network having Al—N bonds and B—N bonds.
Figure 6B:
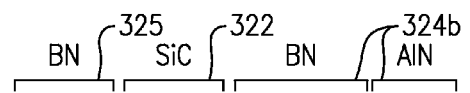

FIGS. 6A and 6B show additional molecular level views of compounds of aluminum, boron and nitrogen in a continuous chemically bonded network having Al—N bonds and B—N bonds. In these examples, a substrate layer 322 is silicon carbide that is covalently bonded to coating 324a and 324b, respectively. In these examples, the substrate layer is one layer among a plurality of layers and is itself on a boron nitride layer 325. In coating 324a, the silicon atom of the substrate layer 322 is covalently bonded to two nitrogen atoms, which in turn are covalently bonded to a single aluminum atom. The aluminum atom is also covalently bonded to another nitrogen atom, which is also covalently bonded to a boron atom. The coating 324b is similar but the boron and aluminum atoms are transposed.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An article comprising:
a plurality of fibers having a conformed coating thereon, the conformed coating including a compound of aluminum (Al), boron (B) and nitrogen (N) including Al—N bonds and B—N bonds, wherein the compound includes an atom of nitrogen covalently bonded to an atom of boron and an atom of aluminum, and the compound has a composition $B_xAl_{(1-x)}N$, where x is 0.001 to 0.999; and
a matrix in which the plurality of fibers is disposed.

2. The article as recited in claim 1, wherein the Al—N bonds and the B—N bonds are molecularly distributed in a continuous chemically bonded network that has a nanodispersion of domains of the Al—N bonds and the B—N bonds.

3. The article as recited in claim 1, wherein the conformed coating has a uniform thickness and consists of the compound of aluminum (Al), boron (B) and nitrogen (N).

4. The article as recited in claim 1, wherein, by weight percentage, the conformed coating includes a greater amount of aluminum (Al) than boron (B).

5. The article as recited in claim 1, wherein the conformal coating includes an amount of B—N, by weight, of no greater than 50%.

6. The article as recited in claim 1, wherein the compound is a continuous chemically bonded network including the Al—N bonds and the B—N bonds.

7. The article as recited in claim 1, wherein the plurality of fibers are selected from the group consisting of silicon-containing fibers, carbon fibers and combinations thereof.

8. The article as recited in claim 7, wherein the plurality of fibers are silicon carbide fibers.

9. The article as recited in claim 1, wherein the conformed coating contacts peripheral surfaces of central cores of the fibers.

10. The article as recited in claim 1, wherein the matrix is a silicon-containing material.

11. The article as recited in claim 1, wherein the compound includes a carbon atom covalently bonded to a silicon atom.

12. The article as recited in claim 1, wherein the compound includes a carbon atom covalently bonded to a nitrogen atom.

13. The article as recited in claim 1, wherein the compound includes a carbon atom bonded to a nitrogen atom and a silicon atom.

14. The article as recited in claim 1, wherein the conformal coating includes an amount of B—N, by weight, of no greater than 10%.

15. The article as recited in claim 14, wherein the compound includes a carbon atom bonded to a nitrogen atom and a silicon atom.

16. The article as recited in claim 1, wherein the conformal coating has a chemical structure selected from the group consisting of:

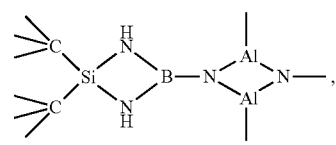

-continued

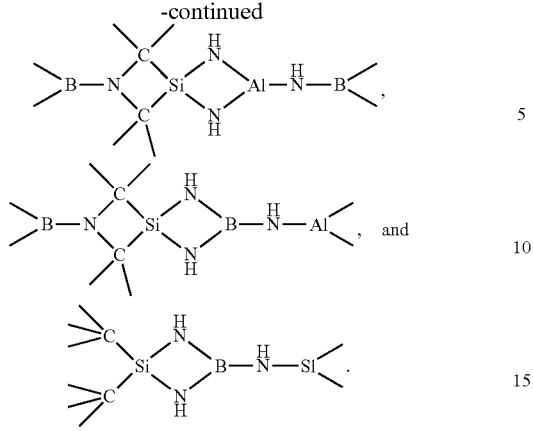

17. A method of protecting an article from environmental conditions, the method comprising:
protecting a substrate that is susceptible to environmental chemical degradation using a coating on the substrate, the coating including a compound of aluminum (Al), boron (B) and nitrogen (N) having Al—N bonds and B—N bonds, the compound includes an atom of nitrogen covalently bonded to atoms of boron and aluminum, and the compound has a composition $B_xAl_{(1-x)}N$, where x is 0.001 to 0.999.

18. The method as recited in claim 17, wherein the coating includes an amount of B—N, by weight, of no greater than 50%.

* * * * *